(12) United States Patent
Pillalamarri et al.

(10) Patent No.: US 9,728,439 B2
(45) Date of Patent: Aug. 8, 2017

(54) HIGH-TEMPERATURE, SPIN-ON, BONDING COMPOSITIONS FOR TEMPORARY WAFER BONDING USING SLIDING APPROACH

(75) Inventors: Sunil K. Pillalamarri, Eagan, MN (US); Chenghong Li, Cary, NC (US)

(73) Assignee: Brewer Science Inc., Rolla, MO (US)

( * ) Notice: Subject to any disclaimer, the term of this patent is extended or adjusted under 35 U.S.C. 154(b) by 760 days.

(21) Appl. No.: 12/770,075

(22) Filed: Apr. 29, 2010

(65) Prior Publication Data

US 2010/0206479 A1 Aug. 19, 2010

Related U.S. Application Data

(62) Division of application No. 11/763,253, filed on Jun. 14, 2007, now abandoned.

(Continued)

(51) Int. Cl.
*B32B 38/00* (2006.01)
*H01L 21/683* (2006.01)
(Continued)

(52) U.S. Cl.
CPC .......... *H01L 21/6835* (2013.01); *B29B 17/02* (2013.01); *B32B 38/10* (2013.01); *B32B 43/006* (2013.01); *C09J 2205/302* (2013.01); *H01L 2221/6834* (2013.01); *H01L 2221/68327* (2013.01); *H01L 2924/30105* (2013.01); *Y10T 156/11* (2015.01); *Y10T 156/1153* (2015.01);
(Continued)

(58) Field of Classification Search
CPC .... C09J 2205/302; B29B 17/02; B32B 43/00;
B32B 38/10; B32B 43/006; Y10T 156/11;
Y10T 156/1153; Y10T 156/1168; Y10T
156/1189; Y10T 156/19; Y10T 156/1911;
Y10T 156/1972
See application file for complete search history.

(56) References Cited

U.S. PATENT DOCUMENTS 3,620,366 A 11/1971 Parkinson et al.
3,868,433 A 2/1975 Bartz et al.
(Continued)

FOREIGN PATENT DOCUMENTS

CN 86102907 11/1987
EP 0 601 615 6/1994
(Continued)

OTHER PUBLICATIONS

International Search Report and Written Opinion dated Mar. 18, 2008 in corresponding PCT/US2007/079204 filed Sep. 21, 2007.

(Continued)

*Primary Examiner* — Philip Tucker
*Assistant Examiner* — Nickolas Harm
(74) *Attorney, Agent, or Firm* — Hovey Williams LLP

(57) ABSTRACT

New compositions and methods of using those compositions as bonding compositions are provided. The compositions comprise a polymer dispersed or dissolved in a solvent system, and can be used to bond an active wafer to a carrier wafer or substrate to assist in protecting the active wafer and its active sites during subsequent processing and handling. The compositions form bonding layers that are chemically and thermally resistant, but that can also be softened to allow the wafers to slide apart at the appropriate stage in the fabrication process.

14 Claims, 6 Drawing Sheets

Related U.S. Application Data

(60) Provisional application No. 60/828,572, filed on Oct. 6, 2006.

(51) Int. Cl.
    *B29B 17/02*    (2006.01)
    *B32B 38/10*    (2006.01)
    *B32B 43/00*    (2006.01)

(52) U.S. Cl.
    CPC .... *Y10T 156/1168* (2015.01); *Y10T 156/1189* (2015.01); *Y10T 156/19* (2015.01); *Y10T 156/1972* (2015.01); *Y10T 428/31678* (2015.04)

(56) References Cited

U.S. PATENT DOCUMENTS

| | | | |
|---|---|---|---|
| 3,944,624 A | 3/1976 | Ruckel | |
| 3,959,062 A | 5/1976 | Hoh et al. | |
| 3,970,494 A | 7/1976 | Pritchard | |
| 3,987,122 A | 10/1976 | Bartz et al. | |
| 4,288,567 A * | 9/1981 | Feeney et al. | 525/99 |
| 4,793,337 A | 12/1988 | Freeman et al. | |
| 4,939,568 A | 7/1990 | Kato et al. | |
| 5,269,868 A * | 12/1993 | Gofuku | B29C 63/0013 156/272.8 |
| 5,447,596 A | 9/1995 | Hayase | |
| 5,646,439 A | 7/1997 | Kitayama et al. | |
| 5,759,344 A * | 6/1998 | Yasunaga | H01L 21/67011 156/701 |
| 5,821,278 A | 10/1998 | Van Der Schaaf et al. | |
| 5,888,650 A | 3/1999 | Calhoun et al. | |
| 6,054,363 A | 4/2000 | Sakaguchi | |
| 6,110,999 A | 8/2000 | Ourth et al. | |
| 6,139,676 A * | 10/2000 | Fernandez | B32B 38/10 156/707 |
| 6,235,818 B1 | 5/2001 | Morizono et al. | |
| 6,440,259 B1 | 8/2002 | Patel | |
| 6,465,558 B2 | 10/2002 | Scheibelhoffer et al. | |
| 6,548,579 B2 | 4/2003 | Reski et al. | |
| 6,627,037 B1 * | 9/2003 | Kurokawa | H01L 21/67132 156/711 |
| 6,653,205 B2 * | 11/2003 | Yanagita | H01L 21/67092 156/763 |
| 6,828,020 B2 | 12/2004 | Fisher et al. | |
| 6,858,667 B1 | 2/2005 | Flerlage et al. | |
| 6,869,894 B2 | 3/2005 | Moore | |
| 6,916,681 B2 | 7/2005 | Asano et al. | |
| 6,933,342 B2 | 8/2005 | Parg et al. | |
| 7,084,201 B2 | 8/2006 | Garfield et al. | |
| 7,098,152 B2 | 8/2006 | Moore | |
| 2002/0195199 A1 * | 12/2002 | Izutani | C09J 7/0207 156/710 |
| 2003/0041960 A1 * | 3/2003 | Sasada | H05K 13/0404 156/247 |
| 2003/0168158 A1 | 9/2003 | Kato | |
| 2004/0121618 A1 | 6/2004 | Moore | |
| 2004/0185187 A1 | 9/2004 | Yokoyama et al. | |
| 2004/0206444 A1 * | 10/2004 | Letertre | H01L 21/76254 156/182 |
| 2004/0260021 A1 | 12/2004 | Macedo et al. | |
| 2004/0266947 A1 | 12/2004 | Macedo et al. | |
| 2005/0164509 A1 | 7/2005 | Koshimizu et al. | |
| 2005/0173064 A1 | 8/2005 | Miyanari | |
| 2005/0181579 A1 | 8/2005 | Thallner | |
| 2005/0236107 A1 * | 10/2005 | Doi | C09J 7/0246 156/710 |
| 2006/0183269 A1 | 8/2006 | Fuergut et al. | |
| 2006/0199353 A1 | 9/2006 | Kub et al. | |
| 2006/0275939 A1 | 12/2006 | Yokoyama et al. | |
| 2007/0185310 A1 | 8/2007 | Moore et al. | |
| 2008/0200011 A1 | 8/2008 | Pillalamarri et al. | |

FOREIGN PATENT DOCUMENTS

| | | |
|---|---|---|
| EP | 1 700 896 | 9/2006 |
| WO | 2006/093639 | 9/2006 |

OTHER PUBLICATIONS

International Preliminary Report on Patentability dated Feb. 3, 2009 in corresponding PCT/US2007/079204 filed Sep. 21, 2007.
Buna EP T 6250, Lanxess, Lanxess Deutschland GmbH, Business Unit Technical Rubber Products, Product Data Sheet.
Eastman, Eastotac, http://www.eastman.com/brands/eastotac/producthome.asp?product=71016204.
Eastman, Product Data Sheet, Eastotac Resin H-142W, http://eastman.com/productcatalogapps/pagecontrollers/proddatasheet_PC.aspx.
Niklaus et al., "Adhesive Wafer Bonding," J. Appl. Phys., 2006, 99, 031101.
Moore et al., "High Temperature Resistant Adhesive for Wafer Thinning and Backside Processing," MANTECH 2004, 8.10.
Brubaker et al., "Advances in Processing of Compound Semiconductor Substrates," MANTECH 2005.
Combe et al., "Reversible Wafer Bonding: Challenges in Ramping up 150mm GaAs Wafer Production to Meet Growing Demand," MANTECH 2006.
Kwon et al., "An Evaluation Process of Polymeric Adhesive Wafer Bonding for Vertical System Integration," Japanese Journal of Applied Physics, vol. 44, No. 6A, 2005, pp. 3893-3902.
Technical DataSheet Abstract Ebecryl 168, UCB Chemicals, Additive, Adhesion promoter/Bonding agent, 2006 SpecialChem S.A., http://www.specialchem4coatings.com/common/pc/product/displayproduct.aspx?id=12887&srchid=220571.
MatWeb, The Online Materials Database: Zeon Chemicals Zeonex 480R Cyclo Olefin Optical Grade Polymer; Subcategory: Cyclo Olefin Polymer, Polymer, Thermoplastic, 2006, http://www.matweb.com/search/SpecificMaterialPrint.asp?bassnum=PZEON6.
Niklaus, Adhesive Wafer Bonding Technology, Department of Signals, Sensors and Systems, Royal Institute of Technology (KTH), Stockholm, Sweden, Copyright 2002.
Grunsven et al., "Wafer Level Chip Size Packaging Technology for Power Devices Using Low Ohmic Through-Hole Vias," 14th European Microelectronics and Packaging Conference and Exhibition, Germany, Jun. 23-25, 2003, pp. 46-50.
Fukushima et al., "New Three-Dimensional Integration Technology Using Chip-to-Wafer Bonding to Archive Ultimate Super-Chip Integration," The Japan Society of Applied Physics, vol. 43, Mo. 4B, 2006, 3030-3035.
Library 4 Science, Pinene, 2006, http://www.chromatography-on-line org/topics/pinene.html.
Technical DataSheet Abstract Vanax 808 Hp, R.T. Vanderbilt, Additive, Crosslinking Catalyst/Accelerator/Initiator Amine or Nitrogen Content, 2006 SpecialChem S.A., 2006, http://www.specialchem4polymers.com/common/pa/product/displayproductaspx?id=7815&srchid=292522.
Ciba Specialty Chemicals, Additives, Polymer Additives, Ciba IRGANOX 1010, Phenolic Primary Antioxidant for Processing and Long-Term Thermal Stabilization, Oct. 1999.
Ciba Specialty Chemicals, Additives, Polymer Additives, Ciba IRGAFOS 168, Hydrolytically Stable Phosphite Processing Stabilizer, Sep. 1999.
Chemical Land 21, Organic Chemicals, Mesitylene.
d-limonene. A data sheet from the Compendium of Pesticide Common Names.
Safety (MSDS) data for Triton X-100.
ExxonMobil Chemical Vistalon, Vistalon 2504 Specifications, 2005.
Material Safety Data Sheet, ExxonMobil Chemical Company, Vistalon Ethylene Propylene Rubber, Apr. 14, 2005.
IDES, The Plastics Web, Zeonex 480R, 2006, http://www.ides.com/grades/ds/E40300.htm.

(56) References Cited

OTHER PUBLICATIONS

Eastman Product Data Sheet, Eastotack H-142W Resin, Sep. 13, 2006, http://www.eastman.com/ProductCatalogApps/PageControllers/ProdDatasheet_PC.aspx?p . . . .
Eastman H-142 Resin, Application Uses and Key Attributes, Sep. 13, 2006, http://www.eastman.com/products/producthome.asp-?product=71016204&SelectorUrl=%2 . . . .
www.sigma-aldrich.com, 457531 Poly-a-pinene, Sep. 13, 2006, http://www.sigmaaldrich.com/catalog/search/ProductDetail/ALDRICH/457531?PrtPrv=1 . . . .
Office Action dated Jul. 22, 2009 in corresponding U.S. Appl. No. 11/763,253, filed Jun. 14, 2007.
Office Action dated Sep. 22, 2009 in corresponding U.S. Appl. No. 11/763,253, filed Jun. 14, 2007.
Office Action dated Dec. 18, 2009 in corresponding U.S. Appl. No. 11/763,253, filed Jun. 14, 2007.
Office Action dated Jun. 7, 2010 in corresponding U.S. Appl. No. 11/763,253, filed Jun. 14, 2007.

\* cited by examiner

HIGH-TEMPERATURE, SPIN-ON, BONDING COMPOSITIONS FOR TEMPORARY WAFER BONDING USING SLIDING APPROACH

RELATED APPLICATIONS

This is a divisional application of U.S. patent application Ser. No. 11/763,253, filed Jun. 14, 2007, entitled HIGH-TEMPERATURE, SPIN-ON, COMPOSITIONS FOR TEMPORARY WAFER BONDING USING SLIDING APPROACH, incorporated by reference herein. The '253 application claims the priority benefit of U.S. Provisional Patent Application No. 60/828,572, entitled HIGH-TEMPERATURE SPIN-ON ADHESIVES FOR TEMPORARY WAFER BONDING USING SLIDING APPROACH, filed Oct. 6, 2006, the entire disclosure of which is incorporated herein by reference.

GOVERNMENT FUNDING

This invention was made with government support under contract number W911SR-05-C-0019 awarded by the United States Army Research, Development, and Engineering Command. The United States Government has certain rights in the invention.

BACKGROUND OF THE INVENTION

Field of the Invention

The present invention is broadly concerned with novel compositions and methods of using those compositions to form bonding compositions that can support active wafers on a carrier wafer or substrate during wafer thinning and other processing.

Description of the Prior Art

Wafer (substrate) thinning has been used to dissipate heat and aid in the electrical operation of the integrated circuits (IC). Thick substrates cause an increase in capacitance, requiring thicker transmission lines, and, in turn, a larger IC footprint. Substrate thinning increases impedance while capacitance decreases impedance, causing a reduction in transmission line thickness, and, in turn, a reduction in IC size. Thus, substrate thinning facilitates IC miniaturization.

Geometrical limitations are an additional incentive for substrate thinning. Via holes are etched on the backside of a substrate to facilitate frontside contacts. In order to construct a via using common dry-etch techniques, geometric restrictions apply. For substrate thicknesses of less than 100 µm, a via having a diameter of 30-70 µm is constructed using dry-etch methods that produce minimal post-etch residue within an acceptable time. For thick substrates, vias with larger diameters are needed. This requires longer dry-etch times and produces larger quantities of post-etch residue, thus significantly reducing throughput. Larger vias also require larger quantities of metallization, which is more costly. Therefore, for backside processing, thin substrates can be processed more quickly and at lower cost.

Thin substrates are also more easily cut and scribed into ICs. Thinner substrates have a smaller amount of material to penetrate and cut and therefore require less effort. No matter what method (sawing, scribe and break, or laser ablation) is used, ICs are easier to cut from thinner substrates. Most semiconductor wafers are thinned after frontside operations. For ease of handling, wafers are processed (i.e., frontside devices) at their normal full-size thicknesses, e.g., 600-700 µm. Once completed, they are thinned to thicknesses of 100-150 µm. In some cases (e.g., when hybrid substrates such as gallium arsenide (GaAs) are used for high-power devices) thicknesses may be taken down to 25 µm.

Mechanical substrate thinning is performed by bringing the wafer surface into contact with a hard and flat rotating horizontal platter that contains a liquid slurry. The slurry may contain abrasive media along with chemical etchants such as ammonia, fluoride, or combinations thereof. The abrasive provides "gross" substrate removal, i.e., thinning, while the etchant chemistry facilitates "polishing" at the submicron level. The wafer is maintained in contact with the media until an amount of substrate has been removed to achieve a targeted thickness.

For a wafer thickness of 300 µm or greater, the wafer is held in place with tooling that utilizes a vacuum chuck or some means of mechanical attachment. When wafer thickness is reduced to less than 300 µm, it becomes difficult or impossible to maintain control with regard to attachment and handling of the wafer during further thinning and processing. In some cases, mechanical devices may be made to attach and hold onto thinned wafers, however, they are subject to many problems, especially when processes may vary. For this reason, the wafers ("active" wafers) are mounted onto a separate rigid (carrier) substrate or wafer. This substrate becomes the holding platform for further thinning and post-thinning processing. Carrier substrates are composed of materials such as sapphire, quartz, certain glasses, and silicon, and usually exhibit a thickness of 1000 µm. Substrate choice will depend on how closely matched the coefficient of thermal expansion (CTE) is between each material.

One method that has been used to mount an active wafer to a carrier substrate comprises the use of a cured bonding composition. The major drawback with this approach is that the composition must be chemically removed, typically by dissolving in a solvent. This is very time-consuming, thus reducing throughput. Furthermore, the use of the solvent adds to the cost and complexity of the process, and it can be hazardous, depending upon the solvent required to dissolve the bonding composition.

Another method for mounting an active wafer to a carrier substrate is via a thermal release adhesive tape. This process has two major shortcomings. First, the tapes have limited thickness uniformity across the active wafer/carrier substrate interface, and this limited uniformity is often inadequate for ultra-thin wafer handling. Second, the thermal release adhesive softens at such low temperatures that the bonded wafer/carrier substrate stack cannot withstand many typical wafer processing steps that are carried out at higher temperatures.

There is a need for new compositions and methods of adhering an active wafer to a carrier substrate that can endure high processing temperatures and that allow for ready separation of the wafer and substrate at the appropriate stage of the process.

SUMMARY OF THE INVENTION

In one embodiment, the present invention is a wafer bonding method wherein a stack comprising first and second substrates bonded together via a bonding layer is preferably subjected to various processing steps (e.g., wafer thinning). The processed stack is then heated to a temperature of at least about 190° C., and a sliding force is applied to at least one of the substrates while causing the other of the substrates to resist the force, such as by securing the other substrate or subjecting it to an opposing force. The force is applied in a sufficient amount so as to separate the substrates.

In another embodiment, the invention provides an article comprising: a first substrate having a back surface and an active surface; a second substrate having a bonding surface; and bonding layer bonded to the active and bonding surfaces.

In one embodiment, the bonding layer is formed of a composition comprising a polymer (or polymer blend) and a tackifier such as a pinene or poly(pinene) dissolved or dispersed in a solvent system, with the polymer including recurring monomers comprising cyclo olefins.

In another embodiment, the invention provides a flowable, bonding composition comprising a tackifier and a polymer including recurring monomers comprising cycloolefins. The tackifier and polymer are dispersed or dissolved in a solvent system that makes up at least about 30% by weight of the composition, based upon the total weight of the composition taken as 100% by weight.

In one embodiment, a flowable, bonding composition comprising a tackifier and a compound selected from the group consisting of rubbers, styrene-isoprene-styrene, styrene-butadiene-styrene, halogenated butyl rubber, and mixtures thereof is provided. The tackifier and compound are dispersed or dissolved in a solvent system that makes up at least about 30% by weight of the composition, based upon the total weight of the composition taken as 100% by weight.

BRIEF DESCRIPTION OF THE DRAWING FIGURES

DETAILED DESCRIPTION OF THE PREFERRED EMBODIMENTS

Figure 1:
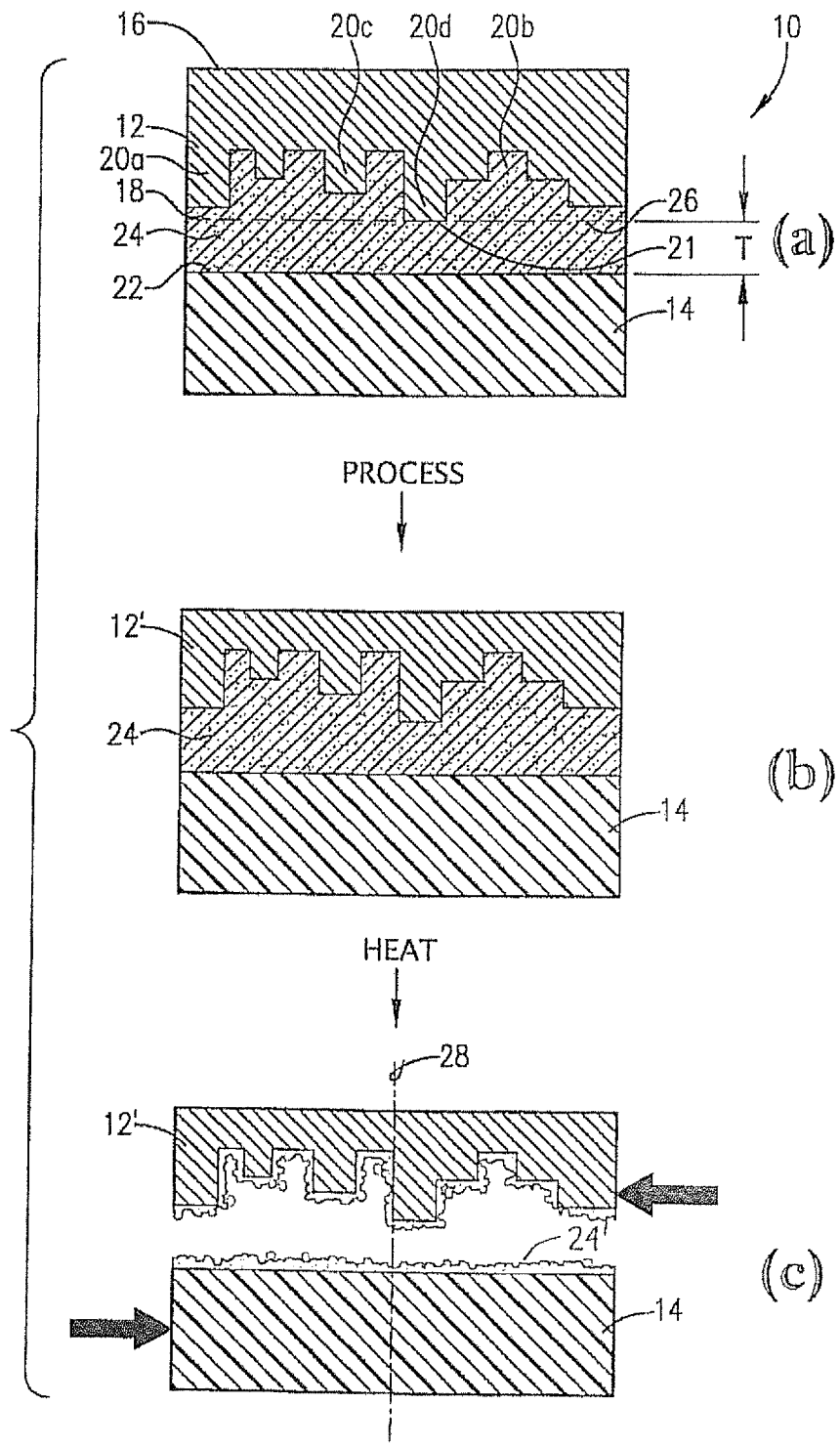
FIG. 1 illustrates the inventive method of thinning and debonding two wafers according to the present invention.

In more detail, the inventive compositions comprise a polymer (which includes a polymer mixture) dispersed or dissolved in a solvent system. The polymer is preferably present in the composition at levels of from about 5% to about 50% by weight, more preferably from about 5% to about 35% by weight, and even more preferably from about 10% to about 35% by weight, based upon the total weight of solids in the composition taken as 100% by weight.

The preferred polymers are thermoplastic and preferably have a weight average molecular weight of from about 500 Daltons to about 1,000,000 Daltons, and more preferably from about 1,000 Daltons to about 500,000 Daltons. Preferred polymers preferably have a softening point (ring and ball softening point) of at least about 50° C., more preferably at least about 100° C., and even more preferably from about 100° C. to about 200° C.

Preferred polymers will be at least about 95%, preferably at least about 98%, and even more preferably about 100% by weight dissolved when allowed to sit at ambient temperatures in a solvent such as limonene, mesitylene, xylene, methyl isoamyl ketone, ethyl acetoacetate, and/or dodecene for a time period of about 1-24 hours.

Some preferred polymers that work in the present invention include those selected from the group consisting of cellulose polymers (such as cellulose acetate polymers), cyclo olefin polymers (such as those sold under the name Zeonex®), rubbers (ethylene-propylene terpolymers (EPM), ethylene-propylene-diene monomers (EPDM)), styrene-isoprene-styrene, styrene-butadiene-styrene, polyolefins, ethylene-vinyl acetate, halogenated butyl rubber, and mixtures thereof.

The composition should comprise at least about 30% by weight solvent system, preferably from about 50 to about 95% by weight solvent system, more preferably from about 65-95% by weight solvent system, and even more preferably from about 65-90% by weight solvent system, based upon the total weight of the composition taken as 100% by weight. The solvent system should have a boiling point of from about 100-200° C., and preferably from about 120-180° C.

Suitable solvents include those selected from the group consisting of limonene (particularly D-limonene), mesitylene, xylene, dodecene, propylene glycol monomethyl ether, methyl isoamyl ketone, ethyl acetoacetate, and mixtures thereof.

In other embodiments, the composition could include a number of optional ingredients, including surfactants, adhesion promoting agents, tackifiers, plasticizer, and antioxidants.

When a surfactant is utilized, it is preferably present in the composition at a level of from about 0.1% to about 3% by weight, and more preferably from about 0.1% to about 1% by weight, based upon the total weight of the solids in the composition taken as 100% by weight. Examples of suitable surfactants include alcohol ethoxylates such as octyl phenol ethoxylate (sold under the name Triton X-100®).

When an adhesion promoting agent is utilized, it is preferably present in the composition at a level of from about 0.1% to about 3% by weight, and preferably from about 0.1% to about 1% by weight, based upon the total weight of the solids in the composition taken as 100% by weight. Examples of suitable adhesion promoting agent include those selected from the group consisting of bis (trimethoxysilylethyl)benzene, aminopropyl tri(alkoxy silanes) (e.g., aminopropyl tri(methoxy silane), aminopropyl tri(ethoxy silanes), N-phenyl aminopropyl tri(ethoxy silane)), and other silane coupling agents.

When a tackifier is utilized, it is preferably present in the composition at a level of from about 50% to about 95% by weight, and preferably from about 75% to about 95% by weight, based upon the total weight of the solids in the composition taken as 100% by weight. The tackifier is preferably a hydrocarbon resin (polymeric and/or monomeric) and preferably has an $M_w$ of from about 300-10,000 Daltons, and more preferably from about 500-5,000 Daltons. Preferred hydrocarbon resins have a softening point (ring and ball softening point) of at least about 80° C., and more preferably from about 120-200° C. Furthermore, it is preferred that the hydrocarbon resin have a Brookfield viscosity at 190° C. of from about 2,500-3,500 cP, preferably from about 2,800-3,200 cP, and even more preferably about 2,900-3,100 cP, Suitable tackifiers include all aliphatic hydrocarbon resins, aromatic hydrocarbon resins, and aliphatic/aromatic hydrocarbon resins as well as those selected from the group consisting of rosins (e.g., terpene rosins), poly(α-pinene), poly(β-pinene), and mixtures thereof. Particularly preferred hydrocarbon resins are sold under the names EASTOTAC, PICCOTAC, and REGALREZ, all available from Eastman Chemical Company.

When an antioxidant is utilized, it is preferably present in the composition at a level of from about 0.01% to about 3% by weight, more preferably from about 0.01% to about 1.5% by weight, and even more preferably from about 0.01% to about 0.1% by weight, based upon the total weight of the solids in the composition taken as 100% by weight. Examples of suitable antioxidants include those selected from the group consisting of phenolic antioxidants (such as pentaerythritol tetrakis(3-(3,5-di-tert-butyl-4-hydroxyphenyl)propionate sold under the name Irganox® 1010 by Ciba) and phosphite antioxidants (such as tris(2,4-ditert-butylphenyl)phosphite sold under the name Irgafos® 168 by Ciba).

The inventive compositions are formed by simply mixing the polymer and other ingredients with the solvent system, preferably at temperatures of from about 20-80° C. for time periods of from about 1-24 hours. The final composition should be thermoplastic (i.e., noncrosslinkable). Thus, the composition will be essentially free (less than about 0.1% by weight and preferably about 0% by weight) of crosslinking agents.

Furthermore, it is preferred that the final composition undergo little or no (i.e., less than about 3%) expansion or change in volume during exposure to different temperatures. To accomplish this, the composition is preferably essentially free (less than about 0.1% by weight and preferably about 0% by weight) of blowing agents and foaming agents. Blowing and foaming agents are compounds that will decompose and release substantial amounts gas under certain conditions (e.g., exposure to high temperatures).

The final compositions will preferably have a Mooney Viscosity (ML (1+4) 125° C.; as determined by ISO289/ASTM D 1646) of less than about 35 MU, preferably less than about 30 MU, and even more preferably from about 5 to about 25 MU.

The viscosity of the final composition will preferably be less than about 1,000 poise, more preferably less than about 500, and even more preferably from about 30 to about 100 poise. For purposes of these measurements, the viscosity is determined via rheological dynamic analysis (TA Instruments, AR-2000, two parallel-plate configuration where the plates have a diameter of 25 mm). Furthermore, this viscosity is determined at 250° C. and there is preferably less than about 3% by weight, and more preferably less than about 2% by weight, loss of the composition. In other words, very little to no thermal decomposition occurs in the composition at this temperature, as determined by thermogravimetric analysis (TGA).

Although the composition could be applied to either the carrier substrate or active wafer first, it is preferred that it be applied to the active wafer first. A preferred application method involves spin-coating the composition at spin speeds of from about 300-3,500 rpm (more preferably from about 500-1,500 rpm), at accelerations of from about 500-15,000 rpm/second, and for spin times of from about 30-300 seconds. It will be appreciated that the application steps can be varied to achieve a particular thickness.

After coating, the substrate can be baked (e.g., on a hot plate) to evaporate the solvents. Typical baking would be at temperatures of from about 150-275° C., and preferably from about 150-225° C. for a time period of from about 2-15 minutes, and more preferably from about 3-10 minutes. The film thickness (on top of the topography) after bake will typically be at least about 5 μm, and more preferably from about 5-50 μm.

After baking, the desired carrier wafer is contacted with, and pressed against, the layer of inventive composition. The carrier wafer is bonded to this inventive composition by heating at a temperature of from about 150-250° C., and preferably from about 180-220° C. This heating is preferably carried out under vacuum and for a time period of from about 1-10 minutes, under a bond force of from about 1 to about 15 kilonewtons.

FIG. 1(a) shows an exemplary stack 10 comprising active wafer 12 and carrier wafer or substrate 14. Active wafer 12 comprises a back surface 16 and an active surface 18. Active surface 18 can comprise one or more active sites (not shown) as well as a plurality of topographical features (raised features or lines as well as holes, trenches, or spaces) such as, for example, those designated as 20a-d. Feature 20d represents the "highest" feature on active surface 18. That is, the end portion or surface 21 is further from back surface 16 of wafer 12 than the respective end portions of any other topographical feature on wafer 12.

Typical active wafers 12 can include any microelectronic substrate. Examples of some possible active wafers 12 include those selected from the group consisting of microelectromechanical system (MEMS) devices, display devices, flexible substrates (e.g., cured epoxy substrates, roll-up substrates that can be used to form maps), compound semiconductors, low k dielectric layers, dielectric layers (e.g., silicon oxide, silicon nitride), ion implant layers, and substrates comprising silicon, aluminum, tungsten, tungsten silicide, gallium arsenide, germanium, tantalum, tantalum nitride, SiGe, and mixtures of the foregoing.

Carrier substrate 14 has a bonding surface 22. Typical carrier substrates 14 comprise a material selected From the group consisting of sapphire, ceramic, glass, quartz, aluminum, silver, and silicon.

Wafer 12 and carrier substrate 14 are bonded together via bonding composition layer 24. Bonding layer 24 is formed of the polymer compositions described above, and has been applied and dried as also described above. As shown in the FIG. 1(a), bonding layer 24 is bonded to active surface 18 of wafer 12 as well as to bonding surface 22 of substrate 14. Unlike prior art tapes, bonding layer 24 is a uniform (chemically the same) material across its thickness. In other words, the entire bonding layer 24 is formed of the same composition.

It will be appreciated that, because bonding layer 24 can be applied to active surface 18 by spincoating, the bonding composition flows into and over the various topographical features. Furthermore, the bonding layer 24 forms a uniform layer over the topography of active surface 18. To illustrate this point, FIG. 1 shows a plane designated by dashed line 26, at end portion 21 and substantially parallel to back surface 16. The distance from this plane to bonding surface 22 is represented by the thickness "T." The thickness T is the total thickness variation, and it will vary by less than about 8%, preferably by less than about 5%, more preferably by less than about 2%, and even more preferably by less than about 1% across the length of plane 26 and substrate 14.

The wafer package can then be subjected to subsequent thinning (or other processing) of the substrate as shown in FIG. 1(b), where 12' presents the wafer 12 after thinning. It will be appreciated that the substrates can be thinned to thicknesses of less than about 100 μm, preferably less than about 50 μm, and more preferably less than about 25 μm. After thinning, typical backside processing, including photolithography, via etching, and metallization, may be performed.

Advantageously, the dried layers of the inventive compositions possess a number of highly desirable properties. For example, the layers will exhibit low outgassing for vacuum etch processes. That is, if a 15-μm thick film of composition is baked at 200° C. for 2 minutes, the solvents will be driven from the composition so that subsequent baking at 200° C. for 60 minutes results in a film thickness change of less than about 5%, preferably less than about 2%, and even more preferably less than about 1% or even 0% (referred to as the "Film Shrinkage Test"). Thus, the dried layers can be heated to temperatures of up to about 190° C., preferably up to about 200° C., more preferably up to about 220° C., and even more preferably up to about 240° C. without physical changes or chemical reactions occurring in the layer. For example, the layers will not soften below these temperatures. In some embodiments, the layers can also be exposed to polar solvents (e.g., NMP, PGME) at a temperature of 85° C. for 90 minutes without reacting.

The bond integrity of the dried layers can be maintained even upon exposure to an acid or base. That is, a dried layer of the composition having a thickness of about 15 μm can be submerged in an acidic media (e.g., concentrated sulfuric acid) or base (e.g., 30 wt. % KOH) at 85° C. for about 45 minutes while maintaining bond integrity. Bond integrity can be evaluation by using a glass carrier substrate and visually observing the bonding composition layer through the glass carrier substrate to check for bubbles, voids, etc. Also, bond integrity is maintained if the active wafer and carrier substrate cannot be separated by hand.

The bonding compositions are also thermally stable. When subjected to the thermogravimetric analysis (TGA) test described herein, the bonding compositions will exhibit a % weight loss (after 200° C. for 60 min) of less than about 4%, preferably less than about 2%, and even more preferably less than about 1%.

After the desired processing has occurred, the active wafer or substrate can be separated from the carrier substrate by heating to temperatures of at least about 190° C., preferably at least about 200° C., more preferably at least about 220° C., and even more preferably at least about 240° C. These temperature ranges represent the preferred softening points of the bonding composition layer. This heating will cause the bonding composition layer to soften and form softened bonding composition layer 24' as shown in FIG. 1(c), at which point the two substrates can be separated by sliding apart. FIG. 1(c) also shows an axis 28, which passes through both of wafer 12 and substrate 14, and the sliding forces would be applied in a direction generally transverse to axis 28. Alternatively, sliding may not be necessary, and instead wafer 12 or substrate 14 can be lifted upward (i.e., in a direction that is generally away from the other of wafer 12 or substrate 14) to separate the wafer 12 from the substrate 14.

It will be appreciated that separation can be accomplished by simply sliding and/or lifting one of wafer 12 or substrate 14 while maintaining the other in a substantially stationary position so as to resist the sliding or lifting force (e.g., by applying simultaneous opposing sliding forces to wafer 12 and substrate 14). This can all be accomplished via conventional equipment.

Any bonding composition remaining in the device areas can be easily removed using the original solvent that was part of the composition prior to drying as well as using solvents such as xylene, benzene, and limonene. Any composition remaining behind will be completely dissolved (at least about 98%, preferably at least about 99%, and more preferably about 100%) after 5-15 minutes of exposure to the solvent. It is also acceptable to remove any remaining bonding composition using a plasma etch, either alone or in combination with a solvent removal process. After this step, a clean, bonding composition-free wafer 12' and carrier substrate 14 (not shown in their clean state) will remain.

EXAMPLES

The following examples set forth preferred methods in accordance with the invention. It is to be understood, however, that these examples are provided by way of illustration and nothing therein should be taken as a limitation upon the overall scope of the invention.

Example 1

Formulations were made by dissolving various cellulose derivatives (obtained from Eastman Chemical Company, Kingsport, Tenn.) in appropriate solvents. The exact materials and quantities used are reported in Table I.

TABLE I

Bonding Composition Formulations from Cellulose Materials.

| INGREDIENTS | SAMPLE 1.1 (g) | SAMPLE 1.2 (g) | SAMPLE 1.3 (g) | SAMPLE 1.4 (g) |
| --- | --- | --- | --- | --- |
| Cellulose acetate (29.5%) butyrate (17%) | 20 | 0 | 0 | 0 |
| Cellulose acetate trimelliate | 0 | 18 | 0 | 0 |
| Cellulose acetate (2%) butyrate (52%) | 0 | 0 | 25 | 0 |
| Cellulose acetate (18.5%) butyrate (31%) | 0 | 0 | 0 | 25 |
| Propylene glycol monomethyl ether | 0 | 82 | 0 | 0 |
| Methyl isoamyl ketone | 50 | 0 | 75 | 50 |
| Ethyl acetoacetate | 30 | 0 | 0 | 25 |

Example 2

Cycloolefin Resin and Poly(α-Pinene) Blend

Formulations were made by dissolving Zeonex 480R resin (obtained from Zeon Chemicals, Louisville, Ky.) and/or poly(α-pinene) (obtained from Aldrich, Milwaukee, Wis.) and/or poly(β-pinene) (obtained from Aldrich, Milwaukee, Wis.) in D-limonene (obtained from Florida Chemical Company). Bis(trimethoxysilylethyl)benzene (obtained from Aldrich, Milwaukee, Wis.) was added as an adhesion promoter. The exact compositions of the formulations are reported in Table II.

TABLE II

Bonding Composition Formulations from Poly(cycloolefin) and Pinene Materials.

| INGREDIENTS | SAMPLE 2.1 (g) | SAMPLE 2.2 (g) | SAMPLE 2.3 (g) | SAMPLE 2.4 (g) |
| --- | --- | --- | --- | --- |
| Zeonex 480R | 120 | 55.9 | 46.05 | 20 |
| Poly(α-pinene) | 0 | 14.3 | 30.7 | 0 |
| Poly(β-pinene) | 0 | 0 | 0 | 5 |
| D-limonene | 280 | 144.8 | 138.15 | 74.875 |
| Bis(trimethoxysilylethyl)benzene | 0.5 | 0.268 | 0.268 | 0.125 |

Example 3

Cycloolefin Resin and Rosin Ester Blend

The formulations were made by dissolving Zeonex 480R resin and Eastotac H142W (obtained from Eastman Chemicals, Kingsport, Tenn.) in a suitable solvent. Irganox 1010 and Irgafos 168 (obtained from Ciba Specialty Chemicals, Tarrytown, N.Y.) were added to one of the formulations to prevent thermal oxidation at high temperatures. Triton X-100 (obtained from Aldrich, Milwaukee, Wis.) was added to reduce de-wetting problems, and bis(trimethoxysilylethyl)benzene was added to promote adhesion. The exact compositions of the formulations are reported in Table III.

TABLE III

Bonding Composition Formulations Based on Poly(cycloolefin) and Rosin Ester Blends.

| INGREDIENTS | SAMPLE 3.1 (g) | SAMPLE 3.2 (g) | SAMPLE 3.3 (g) | SAMPLE 3.4 (g) |
|---|---|---|---|---|
| Zeonex 480R | 3 | 5 g | 7 | 40 |
| Eastotac H142W | 7 | 5 | 3 | 160 |
| D-limonene | 12 | 30 | 30 | 60 |
| Mesitylene | 0 | 0 | 0 | 140 |
| Irganox 1010 | 0 | 0 | 0 | 2 |
| Irgafos 168 | 0 | 0 | 0 | 1 |
| Triton X-100 | 0 | 0 | 0 | 1 |
| Bis(trimethoxysilyl-ethyl)benzene | 0 | 0 | 0 | 1 |

Example 4

EPDM Rubber and Rosin Ester Blend

The formulations were made by dissolving different grades of ethylene propylene diene monomer rubber (EPDM rubber: Buna EP T6250, obtained from Lanxess, Inc., Pittsburgh, Pa.; and Vistalon 2504, Exxon-Mobil Chemical, Houston, Tex.) and Eastotac H142W in a suitable solvent. The antioxidant Irganox 1010 was added to three of the four formulations. The exact compositions of the formulations are reported in Table IV.

TABLE IV

Bonding Composition Formulations Based on EPDM Rubber and Rosin Ester Blends.

| INGREDIENTS | SAMPLE 4.1 (g) | SAMPLE 4.2 (g) | SAMPLE 4.3 (g) | SAMPLE 4.4 (g) |
|---|---|---|---|---|
| Buna EPT 6250 | 0.6 | 1 | 0 | 0 |
| Vistalon 2504 | 0 | 0 | 3.7 | 19.425 |
| Zeonex 480R | 3.4 | 3 | 0 | 0 |
| Eastotac H142W | 16 | 16 | 11.1 | 91.575 |
| D-limonene | 20 | 20 | 25 | 189 |
| Irganox 1010 | 0.2 | 0.2 | 0 | 1.11 |

Example 5

Application, Bonding, and Debonding

Figure 2:
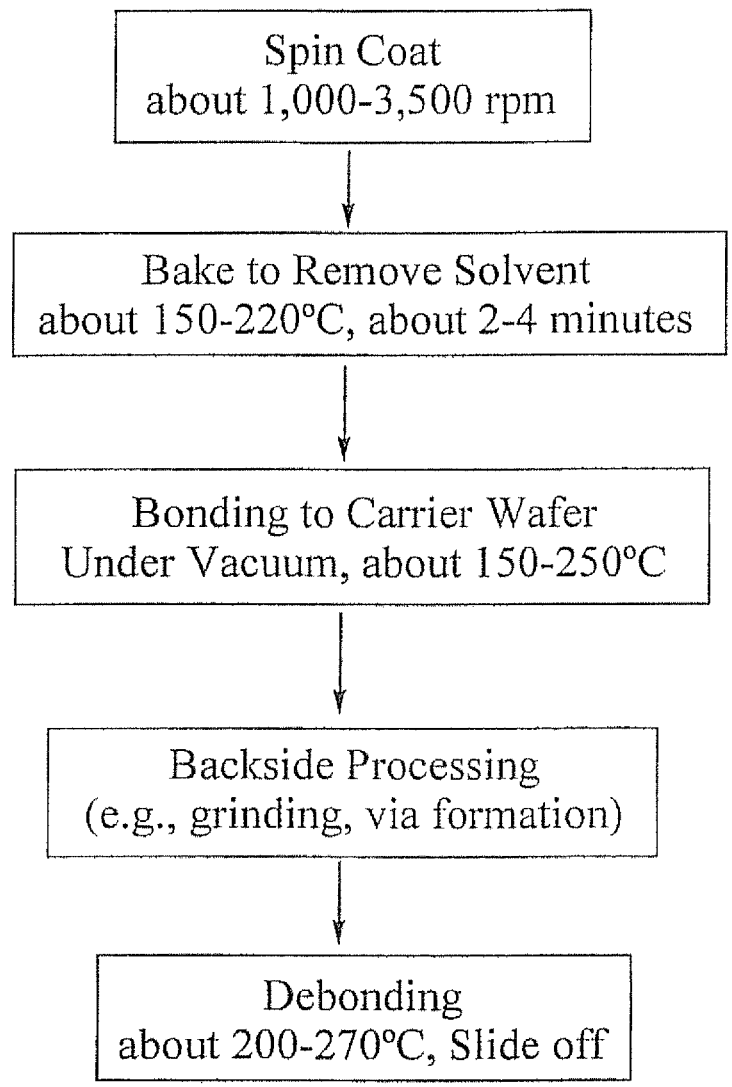
FIG. 2 is a flow diagram showing the process steps followed in the examples.
Figure 3:
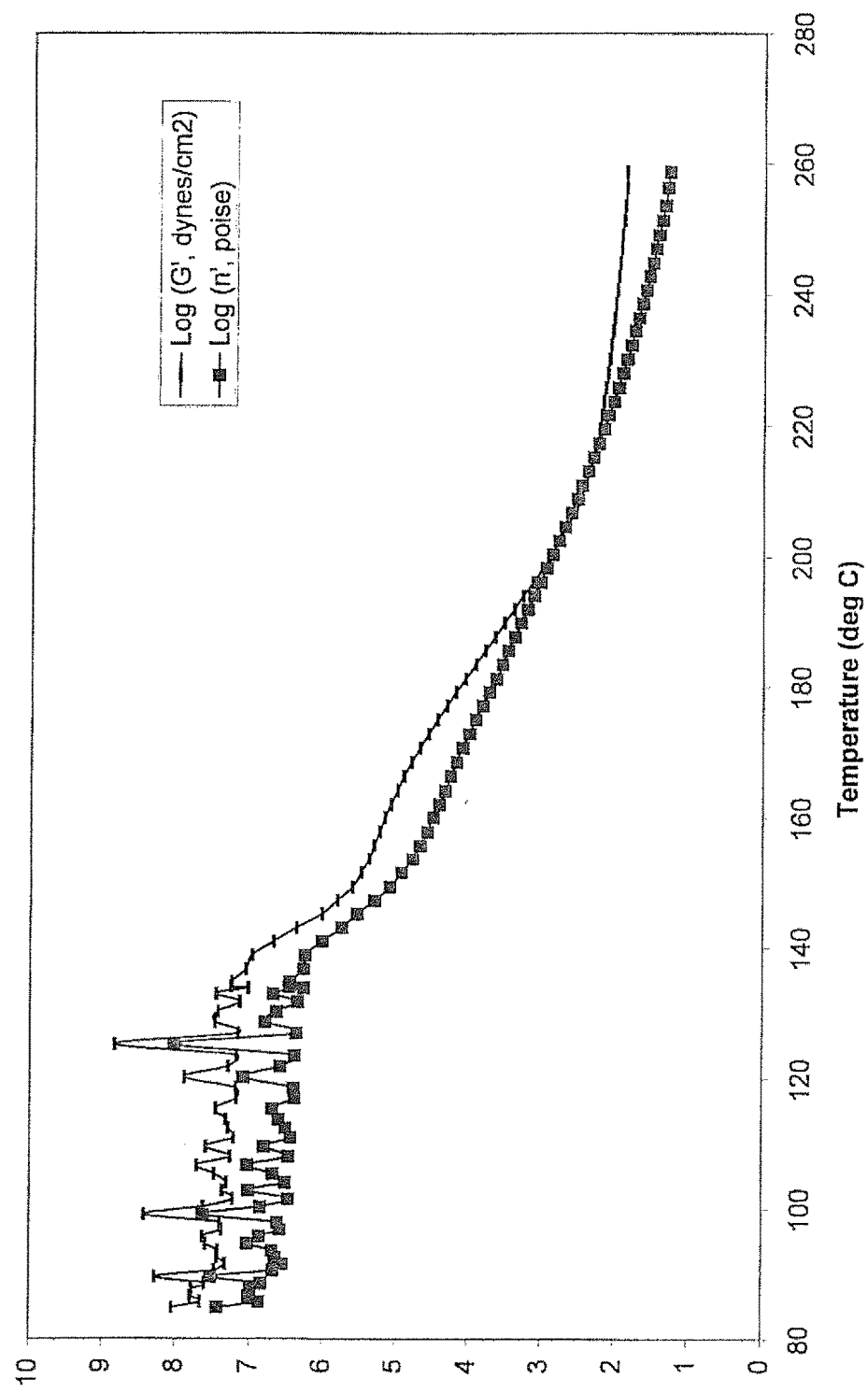
FIG. 3 is a graph depicting the rheological analysis results of a bonding composition described in Example 1.
Figure 4:
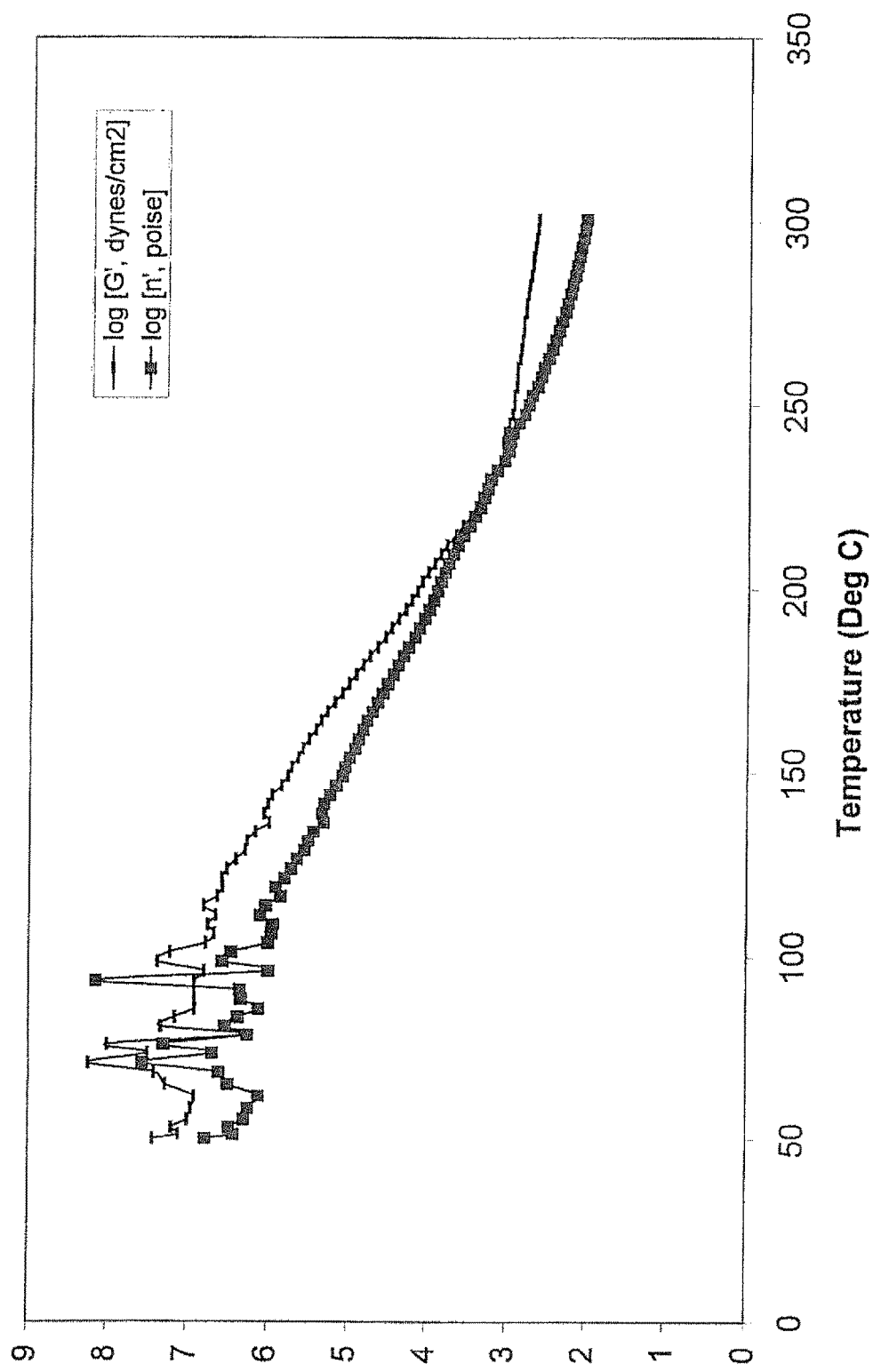
FIG. 4 is a graph depicting the rheological analysis results of a bonding composition described in Example 2.
Figure 5:
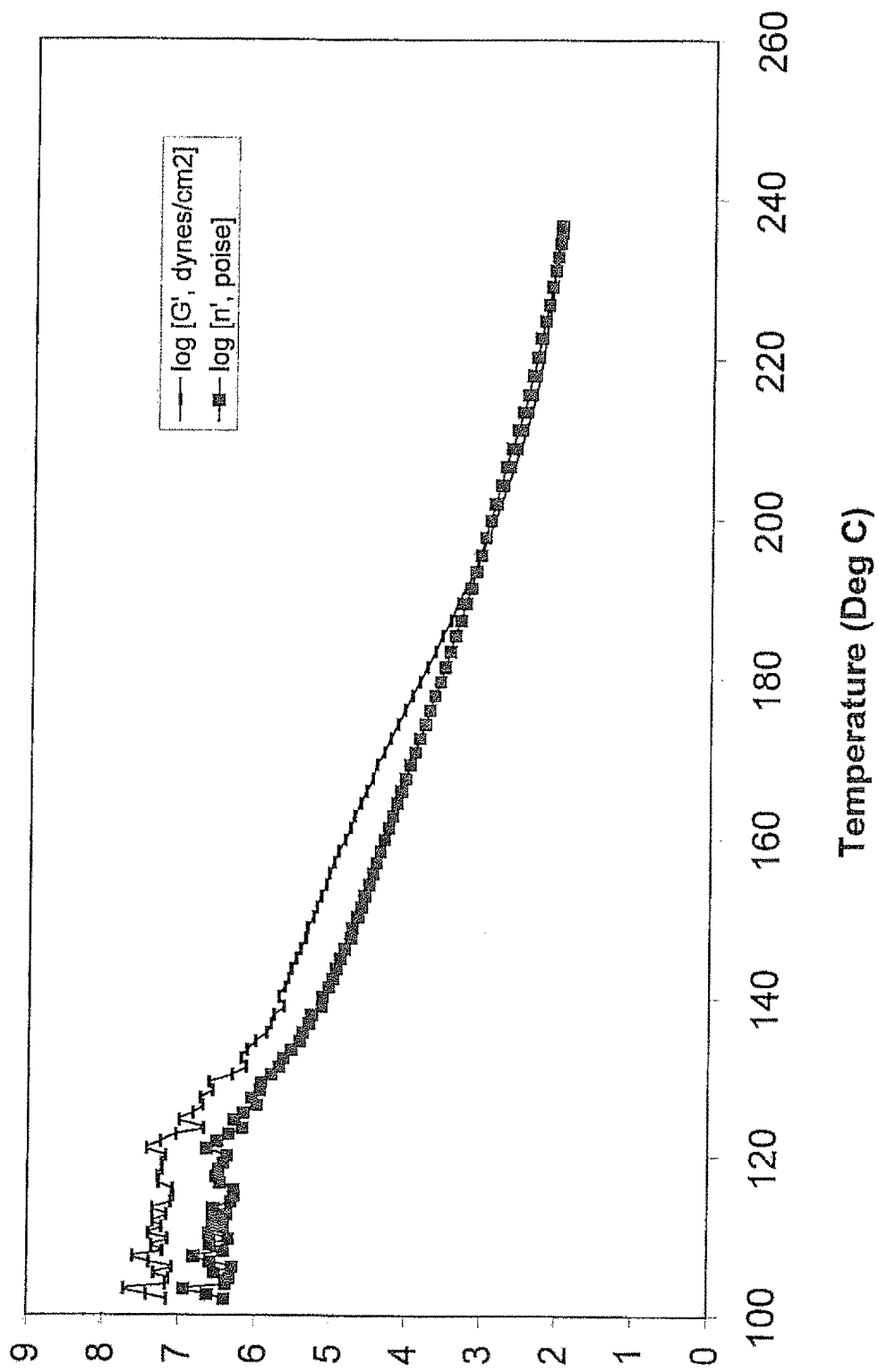
FIG. 5 is a graph depicting the rheological analysis results of a bonding composition described in Example 3.
Figure 6:
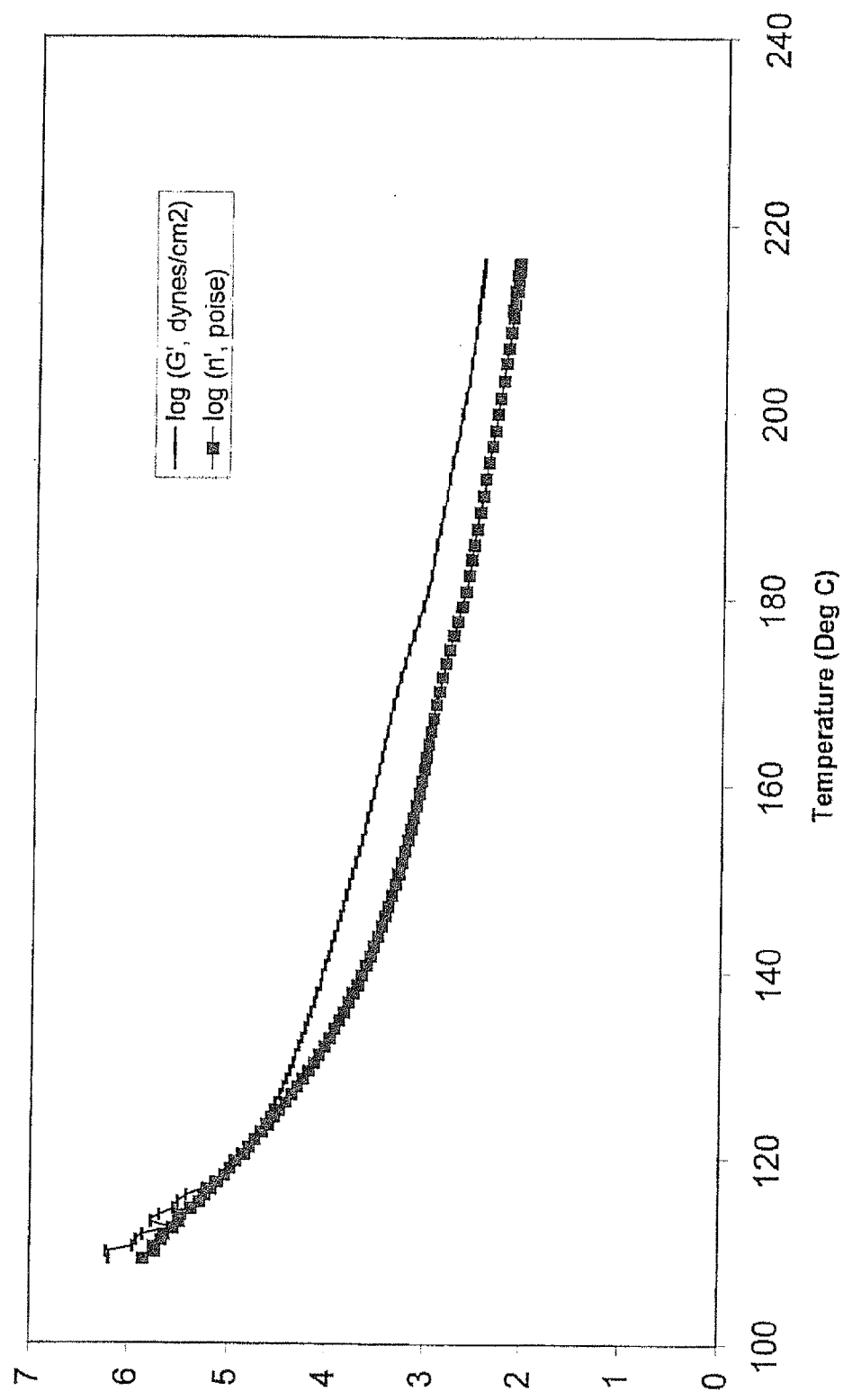
FIG. 6 is a graph depicting the rheological analysis results of a bonding composition described in Example 4.

The formulations from Examples 1-4 were spin-coated onto various substrate wafers. After baking to evaporate the solvent and allowing the bonding composition to reflow, a second wafer was bonded to each coated wafer by applying pressure. The procedure for temporary wafer bonding using these bonding compositions is illustrated in the flow diagram shown in FIG. 2. The bonded wafers were tested for mechanical strength, thermal stability, and chemical resistance. The wafers were tested for debonding by manually sliding them apart at acceptable temperatures.

Example 6

Analysis of the Bonding Compositions

From a rheological analysis, the compositions of Samples 1.4, 2.2, 3.4, and 4.4 were identified as the preferred materials for temporary wafer bonding. FIGS. 3, 4, 5, and 6 shows these results for Samples 1.4, 2.4, 3.4, and 4.4, respectively. The viscosity and modulus values of these materials are reported in Table V, and these materials were successfully tested for debonding. Further studies on thermal stability and chemical resistance were also carried out on these four compositions as described below.

Thermogravimetric analysis (TGA) was carried out on a TA Instruments thermogravimetric analyzer. The TGA samples were obtained by scraping the spincoated and baked bonding composition samples listed in examples. The samples were heated at a rate of 10° C./minute, up to 200° C., and kept constantly at 200° C. for longer periods of time to determine the thermal stability of the particular bonding composition. All of these compositions possessed the required thermal stability at 200° C. and exhibited minimal outgassing (see Table VI).

To determine chemical resistance, two silicon wafers were bonded using the particular bonding composition to be tested. The bonded wafers were put into chemical baths of NMP or 30 wt. % KOH at 85° C., and concentrated sulfuric acid at room temperature to determine chemical resistance. The bond integrity was visually observed after 45 minutes, and the stability of the bonding composition against the respective chemical was determined. All bonding compositions, except for Sample 1.4, retained the bond integrity.

TABLE V

Storage Modulus and Viscosity Values of Bonding Compositions

| Sample Number | G' (dynes/cm$^2$) at 200° C. | h at 200° C. (poise) |
|---|---|---|
| 1.4 | 270 | 244 |
| 2.2 | 2026 | 1782 |
| 3.4 | 736.5 | 847 |
| 4.4 | 463 | 210 |

TABLE VI

Isothermal Thermogravimetric Results - Thermal Stability of Bonding Compositions.

| Sample Number | % Weight loss (200° C./60 min) |
|---|---|
| Example 1.4 | 0.23 |
| Example 2.2 | 0.35 |
| Example 3.4 | 1.5 |
| Example 4.4 | 2 |

We claim:
1. A wafer debonding method comprising:
providing a stack comprising first and second substrates bonded together via a bonding layer formed from a bonding composition comprising:

a tackifier; and
a compound selected from the group consisting of rubbers, styrene-isoprene-styrene, styrene-butadiene-styrene, halogenated butyl rubber, and mixtures thereof,
said tackifier and said compound being dispersed or dissolved in a solvent system, said bonding composition comprising at least about 30% by weight said solvent system, based upon the total weight of the composition taken as 100% by weight, wherein the bonding composition is essentially free of foaming agents;
subjecting said stack to heat so as to soften said bonding layer; and
moving said first substrate and said second substrate relative to each other to separate said first and second substrates from each other.

2. The method of claim 1, wherein said stack has an axis that passes through both the first and second substrates, wherein said first substrate and said second substrate move relative to each other in a direction generally transverse to said axis.

3. The method of claim 1, wherein said first and second substrates move relative to each other in a direction generally perpendicular to mating surfaces of said first and second substrates.

4. The method of claim 1, further comprising subjecting said stack to a temperature of at least about 190° C.

5. The method of claim 1, further comprising thinning one of said substrates prior to subjecting said stack to heat.

6. The method of claim 1, further comprising subjecting said stack to a process selected from the group consisting of backgrinding, metallizing, patterning, and combinations thereof prior to subjecting said stack to heat.

7. The method of claim 1, wherein said bonding composition further comprises an ingredient selected from the group consisting of adhesion promoting agents, antioxidants, surfactants, and mixtures of the foregoing.

8. The method of claim 1, wherein said first substrate has a first surface and a second surface remote from said first surface, said first surface comprising at least one active site and a plurality of topographical features, and said bonding layer is bonded to said second surface of said first substrate.

9. The method of claim 8, wherein said second substrate comprises a bonding surface that is bonded to said bonding layer.

10. The method of claim 9, wherein:
each of said topographical features have an end surface remote from the first surface of said first substrate, at least one of the end surfaces is farther from the first surface of the first substrate than a remaining of said end surfaces and defines a plane that is substantially parallel to said first surface; and
the distance from said plane to the bonding surface on said second substrate varying by less than about 10% across said plane and said bonding surface of said second substrate.

11. The method of claim 1, wherein said first substrate:
has a first surface and a second surface remote from said first surface;
comprises at least one active site and a plurality of topographical features on said second surface; and
is selected from the group consisting of microelectromechanical system devices, display devices, flexible substrates, semiconductors, dielectric layers, ion implant layers, and substrates comprising silicon, aluminum, tungsten, tungsten silicide, gallium arsenide, germanium, tantalum, tantalum nitrite, SiGe, and mixtures of the foregoing.

12. The method of claim 1, wherein said second substrate comprises a carrier wafer comprising a material selected from the group consisting of sapphire, ceramic, glass, quartz, aluminum, silver, and silicon.

13. The method of claim 1, wherein said providing a stack comprises:
applying the bonding composition to one of the first and second substrates to form a bonding composition-coated substrate and a bonding composition-free substrate; and
contacting the bonding composition-free substrate with the bonding composition-coated substrate so as to bond the substrates together.

14. The method of claim 13, wherein said applying comprises spincoating the bonding composition onto one of the first and second substrates.

* * * * *